(12) United States Patent
Sundström et al.

(10) Patent No.: US 10,680,632 B2
(45) Date of Patent: Jun. 9, 2020

(54) TI ADC CIRCUIT

(71) Applicant: Telefonaktiebolaget LM Ericsson (publ), Stockholm (SE)

(72) Inventors: Lars Sundström, Södra Sandby (SE); Martin Anderson, Löddeköpinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/315,212

(22) PCT Filed: Jul. 8, 2016

(86) PCT No.: PCT/EP2016/066256
§ 371 (c)(1),
(2) Date: Jan. 4, 2019

(87) PCT Pub. No.: WO2018/006972
PCT Pub. Date: Jan. 11, 2018

(65) Prior Publication Data
US 2019/0158103 A1    May 23, 2019

(51) Int. Cl.
*H03M 1/06* (2006.01)
*H04B 1/16* (2006.01)
(Continued)

(52) U.S. Cl.
CPC ....... *H03M 1/0675* (2013.01); *H03M 1/0673* (2013.01); *H03M 1/0678* (2013.01);
(Continued)

(58) Field of Classification Search
CPC ....................................................... H04B 1/16
See application file for complete search history.

(56) References Cited

U.S. PATENT DOCUMENTS

| | | | |
|---|---|---|---|
| 7,075,471 B1 * | 7/2006 | Gupta | H03M 1/1215 341/155 |
| 9,294,112 B1 | 3/2016 | Devarajan et al. | |

(Continued)

FOREIGN PATENT DOCUMENTS

| | | |
|---|---|---|
| WO | 2010098982 A1 | 9/2010 |
| WO | 2014135687 A1 | 9/2014 |

OTHER PUBLICATIONS

El-Sankary, K., "New sampling method to improve the SFDR of time-interleaved ADCs", Proceedings of the 2003 International Symposium on Circuits and Systems, Jun. 14-18, 2009, pp. 833-836.

(Continued)

*Primary Examiner* — Shuwang Liu
*Assistant Examiner* — Gina M McKie
(74) *Attorney, Agent, or Firm* — Murphy, Bilak & Homiller, PLLC

(57) ABSTRACT

A TI ADC circuit (30) comprises a plurality of L analog inputs (32-1, 32-2, 32-3) and a plurality of L digital outputs (34-1, 34-2, 34-3). The i:th analog input (32-*i*) is for receiving an i:th analog input signal. The i:th digital output (34-*i*) is for outputting an i:th digital output signal, which is a digital representation of the i:th analog input signal. TI ADC circuit (30) comprises a set (90) of sub ADCs (100-1—100-K). The TI ADC circuit (30) is configured to generate one sample of each of the L digital output signals per conversion cycle. Each sub ADC (100-1—100-K) is configured to generate a digital output sample in M conversion cycles, wherein M is an integer >1. The number K of sub ADCs in the set (90) of sub ADCs (100-1—100-K) exceeds L·M. TI ADC circuit (30) comprises a control circuit (120) configured to select, for each input sample of each of the L analog input signals, which available sub ADC (100-1—100-K) in the set (90) of sub ADCs that should operate on (Continued)

that input sample, such that at least some of the sub ADCs (100-1—100-K), over time, operate on input samples of each of the L analog input signals.

13 Claims, 4 Drawing Sheets

(51) Int. Cl.
    *H04L 27/34*     (2006.01)
    *H03M 1/12*     (2006.01)

(52) U.S. Cl.
    CPC ............... *H04B 1/16* (2013.01); *H04L 27/34* (2013.01); *H03M 1/123* (2013.01); *H03M 1/1215* (2013.01)

(56) References Cited

U.S. PATENT DOCUMENTS

| | | | |
|---|---|---|---|
| 9,793,910 B1* | 10/2017 | Devarajan | H03M 1/0634 |
| 10,009,035 B1* | 6/2018 | LaCroix | H03M 1/007 |
| 2013/0141261 A1* | 6/2013 | Johancsik | H03M 1/54 |
| | | | 341/118 |
| 2015/0070203 A1* | 3/2015 | Dedic | H03M 1/125 |
| | | | 341/161 |
| 2016/0020777 A1 | 1/2016 | Sundblad et al. | |

OTHER PUBLICATIONS

Thillo, W. Van, "A Flexible Antenna Selection Scheme for 60 GHz Multi-Antenna Systems Using Interleaved ADCs", 2009 IEEE International Conference on Communications, Jun. 14-18, 2009, pp. 1-5.

* cited by examiner

TI ADC CIRCUIT

TECHNICAL FIELD

The present invention relates to a time-interleaved analog-to-digital converter circuit.

BACKGROUND

An analog-to-digital converter (ADC) is an interface between the analog domain and the digital domain. Several different ADC architectures exist. The time-interleaved (TI) ADC architecture can be used in order to achieve a relatively high sampling rate. A number M of slower sub ADCs are configured to operate on the same input signal, but on different samples. Each sub ADC is configured to operate on every Mth sample. Thereby, an overall increase in sampling rate with a factor M is achieved for the TI ADC compared with an individual sub ADC.

A problem with TI ADCs is that mismatch between individual sub ADCs, e.g. gain and dc offset mismatch, causes distortion in the output signal of the TI ADC, typically showing up as spurious tones, visible as peaks in a signal spectrum.

One way to reduce such unwanted peaks is to add additional, redundant, sub ADCs to the TI ADC. Thereby, there are several sub ADCs available for each new sample. Hence, the order in which the sub ADCs are operated does not have to be periodic, but can be scrambled, e.g. in a random or pseudo random way. In this way, distortion peaks can be reduced, and the errors are smeared out over a larger frequency range. In this disclosure, we refer to such a TI ADC as a redundant TI ADC. An example of such a redundant TI ADC is given in K. El-Sankary, A. Assi and M. Sawan, "New sampling method to improve the SFDR of time-interleaved ADCs," *Circuits and Systems, 2003. ISCAS '03. Proceedings of the* 2003 *International Symposium on*, 2003, pp. I-833-I-836 vol.1.

SUMMARY

In some situations, several TI ADCs coexist, e.g. on the same chip. For instance, in a quadrature receiver circuit, there can be one TI ADC for an in-phase (I) channel and another TI ADC for a quadrature-phase (Q) channel. The inventors have realized that when two or more redundant TI ADCs coexist, they can share at least some sub ADCs. Thereby, a given performance can be reached at a lower hardware cost, compared with if two separate redundant TI ADCs, not sharing any sub ADCs, were used.

According to a first aspect, there is provided a TI ADC circuit. The TI ADC circuit comprises a plurality of L analog inputs and a plurality of L digital outputs. The i:th analog input is for receiving an i:th analog input signal. The i:th digital output is for outputting an i:th digital output signal, which is a digital representation of the i:th analog input signal. TI ADC circuit comprises a set of sub ADCs. The TI ADC circuit is configured to generate one sample of each of the L digital output signals per conversion cycle. Each sub ADC is configured to generate a digital output sample in M conversion cycles, wherein M is an integer >1. The number K of sub ADCs in the set of sub ADCs exceeds L·M. TI ADC circuit comprises a control circuit configured to select, for each input sample of each of the L analog input signals, which available sub ADC in the set of sub ADCs that should operate on that input sample, such that at least some of the sub ADCs, over time, operate on input samples of each of the L analog input signals.

The control circuit may be configured to select the sub ADCs such that each of the sub ADCs over time, operates on input samples of each of the L analog input signals.

The control circuit may be configured to select the sub ADCs according to a random or pseudo random selection scheme.

In an embodiment, L=2 and the plurality of analog inputs thus comprises a first analog input for receiving a first analog input signal and a second analog input for receiving a second analog input signal. Furthermore, in this embodiment, the plurality of digital outputs accordingly comprises a first digital output for outputting a first digital output signal, which is a digital representation of the first analog input signal and a second digital output for outputting a second digital output signal, which is a digital representation of the second analog input signal. Moreover, in this embodiment, the number K of sub ADCs in the set of sub ADCs>2M, and the control circuit is configured to select, for each input sample of the first analog input signal and the second analog input signal, which available sub ADC in the set of sub ADCs that should operate on that input sample, such that at least some of the sub ADCs sometimes operate on input samples of the first analog input signal and sometimes operate on input samples of the second analog input signal. The first analog input signal may be an in-phase (I) component and the second analog input signal may be a quadrature-phase (Q) component of a quadrature communication signal.

According to a second aspect, there is provided a receiver circuit comprising the TI ADC circuit according to the first aspect for converting a received analog signal to a digital representation.

According to a third aspect, there is provided a communication apparatus comprising the receiver circuit according to the second aspect. The communication apparatus may, for instance, be a wireless communication device for communication with a cellular network, or a radio base station for a cellular communication network.

According to a fourth aspect, there is provided a method of controlling the TI ADC circuit according to the first aspect. The method comprises selecting, by the control circuit and for each input sample of each of the L analog input signals, which available sub ADC in the set of sub ADCs that should operate on that input sample, such that at least some of the sub ADCs, over time, operate on input samples of each of the L analog input signals.

Selecting sub ADCs may comprise selecting the sub ADCs such that each of the sub ADCs over time, operates on input samples of each of the L analog input signals.

For the above-mentioned embodiment of the TI ADC circuit where L=2, selecting the sub ADCs comprises selecting, by the control circuit and for each input sample of the first analog input signal and the second analog input signal, which available sub ADC in the set of sub ADCs that should operate on that input sample, such that at least some of the sub ADCs sometimes operate on input samples of the first analog input signal and sometimes operate on input samples of the second analog input signal.

According to a fifth aspect, there is provided a computer program product comprising computer program code for executing the method according to the fourth aspect when said computer program code is executed by the control circuit of the TI ADC circuit.

According to a sixth aspect, there is provided a computer readable medium having stored thereon a computer program product comprising computer program code for executing the method according to the fourth aspect when said computer program code is executed by the control circuit of the TI ADC circuit.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
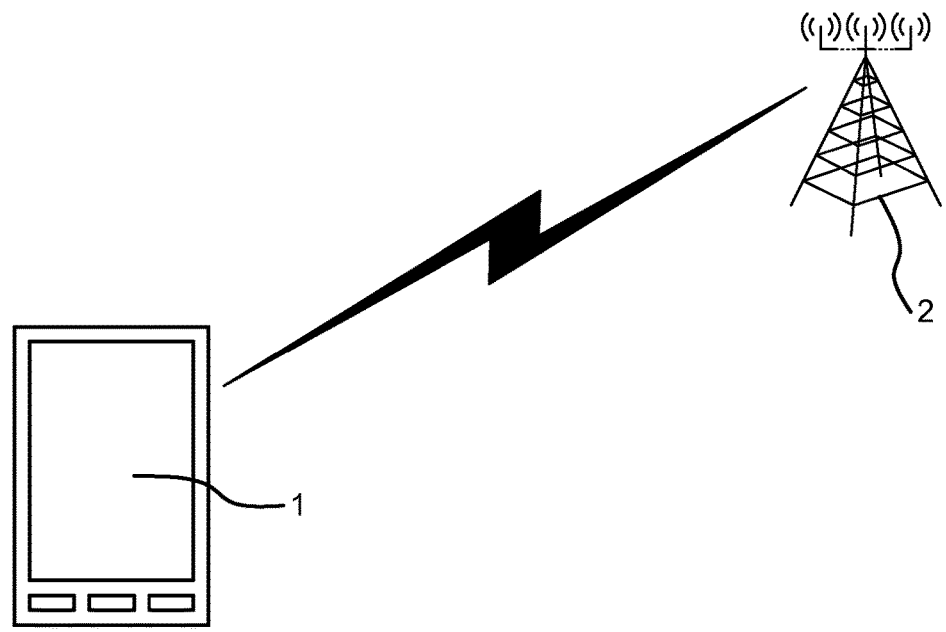
FIG. 1 illustrates a communication environment.

FIG. 1 illustrates a communication environment wherein embodiments of the present invention may be employed. A wireless device 1 of a cellular communications system is in wireless communication with a radio base station 2 of the cellular communications system. The wireless device 1 may be what is generally referred to as a user equipment (UE). The wireless device 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

It should also be noted that embodiments of ADCs described herein may be used in other electronic apparatuses than communication apparatuses as well, wherever a conversion from the analog to the digital domain is needed.

Figure 2:
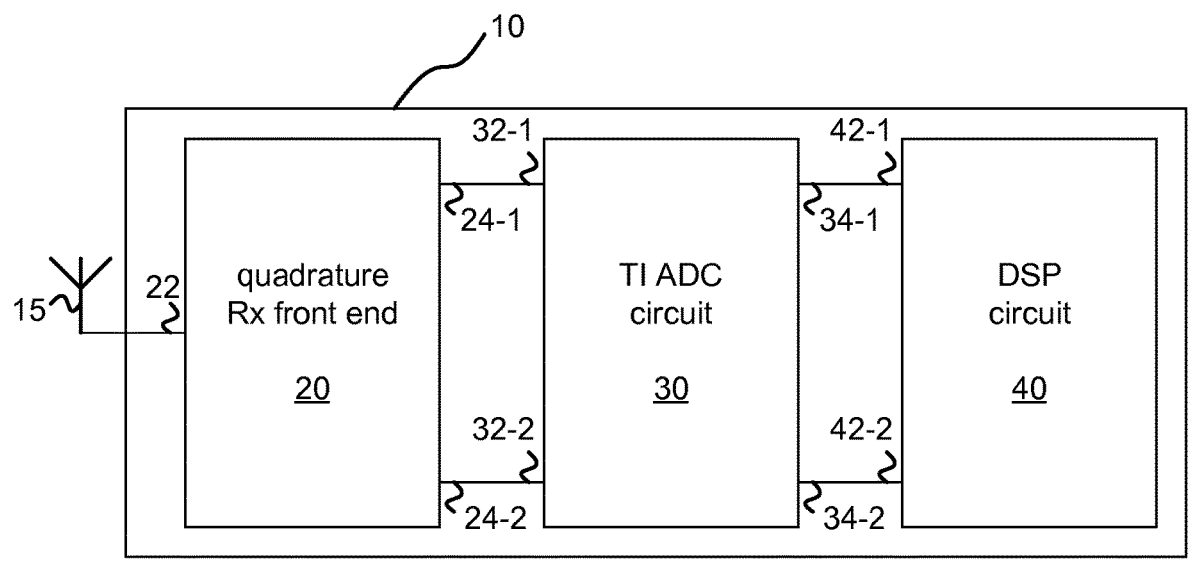
FIGS. 2-4 show block diagrams.

FIG. 2 shows a block diagram of an embodiment of a receiver circuit 10, which may e.g. be comprised in a communication apparatus, such as the wireless device 1 or radio base station 2. In the embodiment illustrated in FIG. 2, the receiver circuit 10 comprises a quadrature receiver (Rx) front-end circuit 20 connected to an antenna 15 at an input 22 of the quadrature Rx front-end circuit 20 for receiving radio-frequency (RF) signals. The quadrature Rx front-end circuit 15 may e.g. comprise one or more filters, low-noise amplifiers, mixers, etc., for downconverting the received RF signals to a lower-frequency signal, such as a baseband signal. In FIG. 2, the quadrature Rx front-end circuit 20 has a first output 24-1 for outputting an I component, and a second output 24-2 for outputting a Q component. The design of such quadrature Rx front-end circuits are well known and is not discussed in any further detail herein.

In FIG. 2, the radio receiver circuit 10 further comprises a TI ADC circuit 30, to be further described below in the context of various embodiments. The TI ADC circuit 30 has a first analog input 32-1 for receiving a first analog input signal. In the configuration of FIG. 2, the first analog input signal is the I component from the quadrature Rx front-end circuit 20. Furthermore, the TI ADC circuit 30 has a second analog input 32-2 for receiving a second analog input signal. In the configuration of FIG. 2, the second analog input signal is the Q component from the quadrature Rx front-end circuit 20. Moreover, the TI ADC circuit 30 has a first digital output 34-1 for outputting a first digital output signal, which is a digital representation of the first analog input signal. The TI ADC circuit 30 also has a second digital output 34-2 for outputting a second digital output signal, which is a digital representation of the second analog input signal.

In FIG. 2, the receiver circuit 10 further comprises a digital signal processing (DSP) circuit 40, configured to receive the digital output signals from the TI ADC circuit 30 on inputs 42-1 and 42-2 of the DSP circuit 40. The DSP circuit 30 may be configured to process the digital output signals from the TI ADC circuit 30 to recover received data, e.g. according to methods well known in the art of radio communications, which are not further discussed herein.

Figure 3:
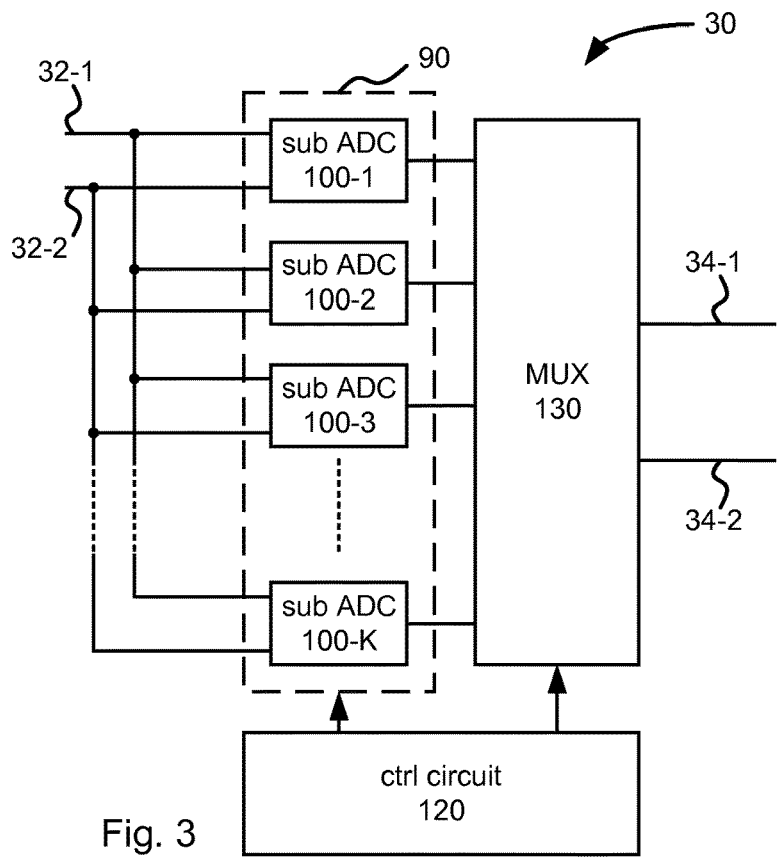

FIG. 3 is a block diagram of the TI ADC circuit 30 according to an embodiment. It comprises a set 90 of sub ADCs 100-1—100-K. The TI ADC circuit 30 is configured to generate one sample of the first digital output signal and one sample of the second digital output signal per conversion cycle. This can be seen as a definition of what is meant by the term "conversion cycle" in this disclosure. Each sub ADC 100-1—100-K is configured to generate a digital output sample in M conversion cycles, wherein M is an integer >1. Hence, if such sub ADCs were to be used in a non-redundant TI ADC with a single input and output with the same conversion cycle, M such sub ADCs would be used. If two such non-redundant TI ADCs were to be implemented side by side, e.g. one for the I channel and one for the Q channel, the number of sub ADCs would be 2M. In the embodiment of the TI ADC circuit illustrated in FIG. 2, the number K of sub ADCs in the set 90 exceeds 2M. Thus, there is a redundancy in the number of sub ADCs, which can be exploited for scrambling the order in which the sub ADCs are used, which in turn facilitates reduction of spurious tones.

To exploit the redundancy, the TI ADC circuit 30 comprises a control circuit 120 configured to select, for each input sample of the first analog input signal and the second analog input signal, which available sub ADC 100-1—100-K in the set 90 of sub ADCs that should operate on that input sample. In embodiments, the control circuit is configured to do the selection such that at least some of the sub ADCs 100-1—100-K sometimes operate on input samples of the first analog input signal and sometimes operate on input samples of the second analog input signal. Over time, each of these sub ADCs (i.e. each of the "at least some of the sub ADCs"), operates on input samples of each of the first and the second analog input signals.

The TI ADC circuit 30 disclosed herein can be seen as two redundant TI ADCs, one having the input 32-1 and output 34-1 and one having the input 32-2 and the output 34-2, that share at least some of the sub ADCs, namely those that sometimes operate on input samples of the first analog input signal and sometimes operate on input samples of the second analog input signal. In FIG. 3, all of the sub ADCs 100-1—100-K are connected to both the inputs 32-1 and 32-2 and sometimes operate on input samples of the first analog input signal and sometimes operate on input samples of the second analog input signal. In other words, in this embodiment, the control circuit 120 is configured to select the sub ADCs 100-1—100-K such that each of the sub ADCs 100-1—100-K sometimes operates on input samples of the first analog input signal and sometimes operates on input samples of the second analog input signal. Thus, over time, each of the K sub ADCs operates on input samples of each of the first and the second analog input signals. Hence, in the embodiment illustrated in FIG. 3, all sub ADCs 100-1—100-K are shared between the two redundant TI ADCs. However, in other embodiments, a subset of the sub ADCs 100-1—100-K may be shared, whereas other subsets only operate on the first or the second analog input signal.

As illustrated in FIG. 3, the TI ADC circuit 30 may comprise a multiplexer 130, or similar circuit, configured to direct the digital outputs of the correct sub ADCs to the outputs 34-1 and 34-2 for each conversion cycle. The control circuit 120, which selects which sub ADC 100-1—100-K is used for which sample and thus knows which sub ADCs 100-1—100-K should be connected the digital outputs 34-1 and 34-2 for any given conversion cycle, can be configured to control the multiplexer 130. Other solutions are possible as well. For example, each of the sub ADCs may comprise tri-state output buffers that are activated only during a single conversion cycle, when the sub ADC has finished its most resent conversion. Each sub ADC may comprise two sets of tri-state output buffers; one connected to the first digital output 34-1 and one connected to the second digital output 34-2. Only the set of tri-state buffers that is connected to the digital output, 34-1 or 34-2, to which the digital output of the sub ADC should be delivered, may then be activated. In such an implementation, no dedicated multiplexer 130 is needed.

Figure 4:
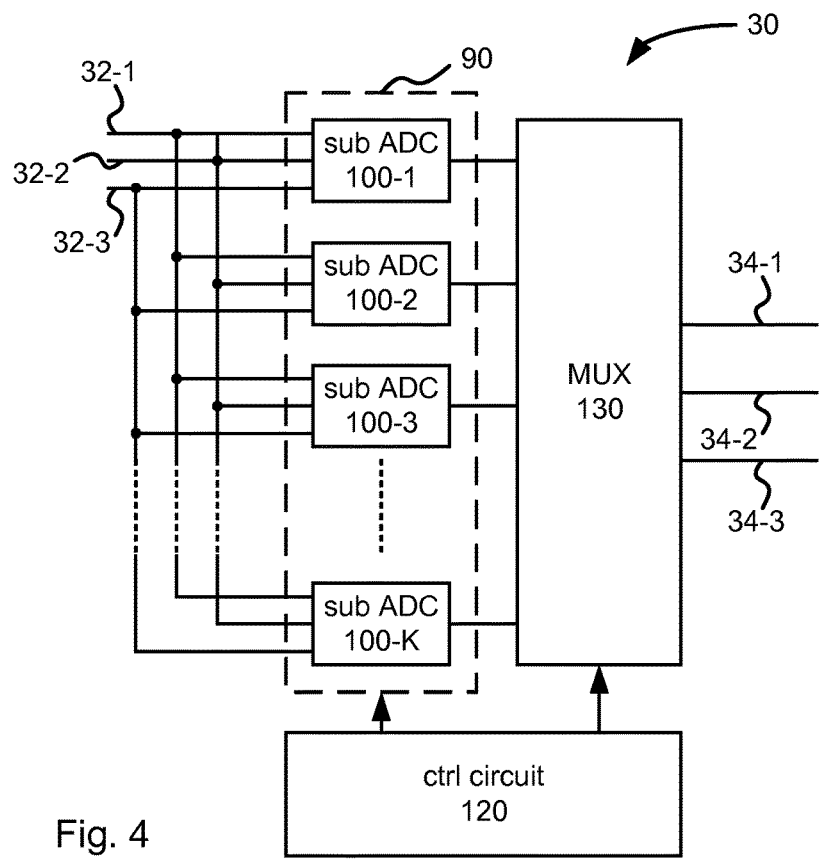

According to some embodiments, the TI ADC circuit may be extended to more than two inputs and outputs. This is illustrated in FIG. 4 with an embodiment of the TI ADC circuit 30 having a third analog input 32-3 for receiving a third analog input signal and a third digital output 34-3 for outputting a third digital output signal, which is a digital representation of the third analog input signal. In this embodiment, the control circuit 120 is configured to select, for each input sample of the first analog input signal, the second analog input signal, and the third analog input signal, which available sub ADC 100-1—100-K in the set of sub ADCs 100-1—100-K that should operate on that input sample, such that at least some of the sub ADCs 100-1—100-K sometimes operate on input samples of the first analog input signal, sometimes operate on input samples of the second analog input signal, and sometimes operate on input samples of the third analog input signal. Over time, each of these sub ADCs (i.e. each of the "at least some of the sub ADCs"), operates on input samples of each of the first, the second, and the third analog input signals Similar to embodiments of the TI ADC circuit 30 with two inputs and two outputs discussed above, the control circuit 120 may, in some embodiments, be configured to select the sub ADCs 100-1—100-K such that each of the sub ADCs 100-1—100-K sometimes operates on input samples of the first analog input signal, sometimes operates on input samples of the second analog input signal, and sometimes operates on input samples of the third analog input signal. Thus, over time, each of the K sub ADCs operates on input samples of each of the first, the second, and the third analog input signals. This is the case in FIG. 4, where all of the sub ADCs 100-1—100-K are connected to all three inputs 32-1, 32-2, and 32-3. In the case of three inputs, the number K exceeds 3M.

In a more general case, an embodiment of the TI ADC circuit 30 has a plurality of L analog inputs 32-1, 32-2, 32-3, . . . and a plurality of L digital outputs 34-1, 34-2, 34-3, . . . Here, L is an integer that exceeds 1. In FIG. 3, L=2. In FIG. 4, L=3. For an integer index $i \in [1, L]$, the i:th analog input 32-$i$ is for receiving an i:th analog input signal, and the i:th digital output 34-$i$ is for outputting an i:th digital output signal, which is a digital representation of the i:th analog input signal. The TI ADC circuit 30 is configured to generate one sample of each of the L digital output signals per conversion cycle. The number K of sub ADCs in the set 90 of sub ADCs 100-1—100-K exceeds L·M. The control circuit 120 configured to select, for each input sample of each of the L analog input signals, which available sub ADC 100-1—100-K in the set 90 of sub ADCs that should operate on that input sample, such that at least some, possibly each, of the sub ADCs 100-1—100-K, over time, operate on input samples of each of the L analog input signals.

In some embodiments, the control circuit 120 is configured to select the sub ADCs 100-1—100-K according to a random or pseudo random selection scheme. For example, the control circuit may comprise a random, or pseudo random, generator circuit configured to generate a random, or pseudo random, sequence which is used, for each sample, to select which available sub ADC should operate on that sample of the first analog input signal and which of the available sub ADC should operate on that sample of the second analog input signal. Below, we refer to this as random, or pseudo random, scrambling of the order in which the sub ADCs are used.

An alternative to the embodiments disclosed herein is to implement L separate redundant TI ADCs, i.e. with no shared sub ADCs. This is used as a comparative reference example to illustrate the benefits of the disclosed embodiments. Behavioral-level simulations on a TI ADC circuit 30 with two inputs and outputs (i.e. L=2) and with all sub ADCs shared performed in a numerical computer simulation environment, including modeled gain and offset errors and using random scrambling, has shown that for a given total number K of sub ADCs, the TI ADC circuit 30 has a higher performance in terms of suppressing spurious tones compared with the reference example with two separate redundant TI ADCs with K/2 sub ADCs each. Hence, for a given required performance in terms of suppressing spurious tones, the total number K of sub ADCs needed is lower for the TI ADC circuit 30 than for the reference example with two separate redundant TI ADCs. Examples of such simulation results are presented with reference to FIGS. 8-9.

Figure 5:
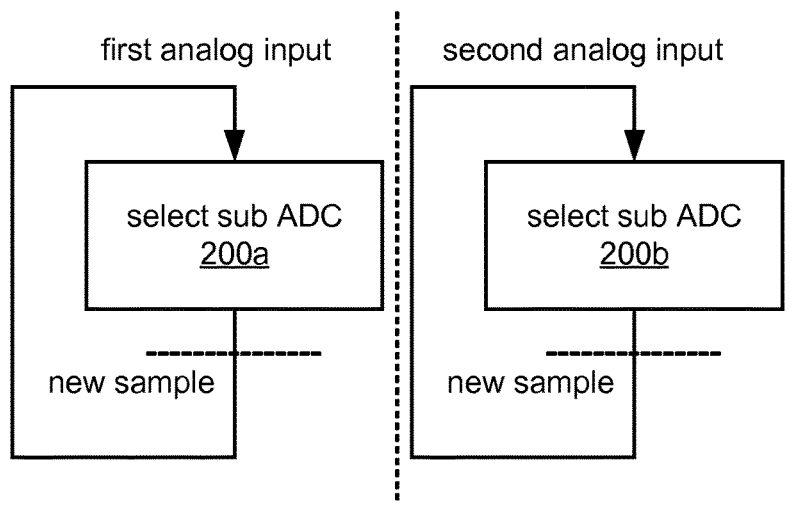
FIGS. 5-6 show flowcharts.

According to some embodiments, there is provided a method of controlling the TI ADC circuit 30. An embodiment of the method suitable for controlling the embodiment of the TI ADC circuit 30 in FIG. 3 is illustrated with a flowchart in FIG. 5. The embodiment comprises the operations 200$a$ and 200$b$ of selecting, by the control circuit 120 and for each input sample of the first analog input signal and the second analog input signal, which available sub ADC 100-1—100-K in the set of sub ADCs 100-1—100-K that should operate on that input sample, such that at least some of the sub ADCs sometimes operate on input samples of the first analog input signal and sometimes operate on input samples of the second analog input signal.

In line with what is discussed above, in some embodiments, the operations 200$a$ and 200$b$ may comprise selecting the sub ADCs 100-1—100-K such that each of the sub ADCs 100-1—100-K sometimes operates on input samples of the first analog input signal and sometimes operates on input samples of the second analog input signal.

Figure 6:
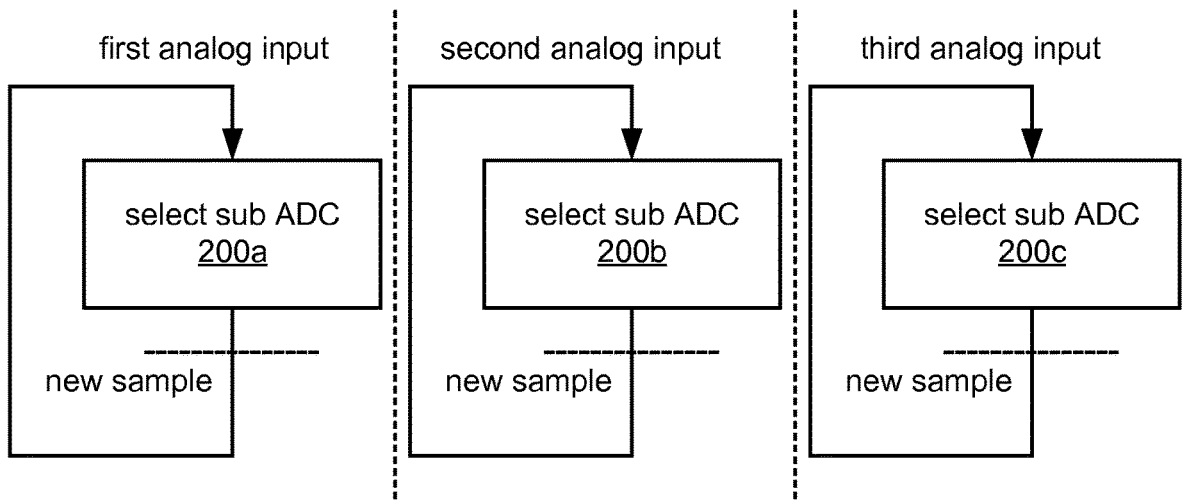

An embodiment of the method suitable for controlling the embodiment of the TI ADC circuit 30 in FIG. 4 is illustrated with a flowchart in FIG. 6. The embodiment comprises the operations 200a, 200b, and 200c of selecting, by the control circuit 120 and for each input sample of the first analog input signal, the second analog input signal, and the third analog input signal which available sub ADC 100-1—100-K in the set of sub ADCs 100-1—100-K that should operate on that input sample, such that at least some of the sub ADCs sometimes operate on input samples of the first analog input signal, sometimes operate on input samples of the second analog input signal, and sometimes operate on input samples of the third analog input signal.

In line with what is discussed above, in some embodiments, the operations 200a, 200b, and 200c may comprise selecting the sub ADCs 100-1—100-K such that each of the sub ADCs sometimes operate on input samples of the first analog input signal, sometimes operate on input samples of the second analog input signal, and sometimes operate on input samples of the third analog input signal.

For the more general case discussed above with L analog inputs and L digital outputs, embodiments of the method comprise operations 200a, 200b, ... of selecting, by the control circuit and for each input sample of the L analog input signals, which available sub ADC 100-1—100-K in the set 90 of sub ADCs that should operate on that input sample, such that at least some, possibly each, of the sub ADCs 100-1—100-K, over time, operate on input samples of each of the L analog input signals.

The operations 200a, 200b, ..., may include random or pseudo-random scrambling.

Figure 7:
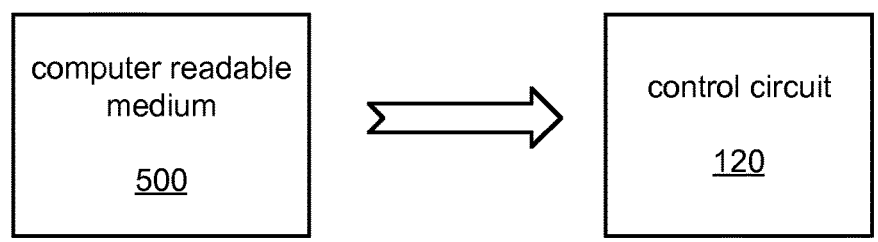
FIG. 7 illustrates a computer-readable medium.

In some embodiments, the control circuit 120 may be implemented as a dedicated application-specific hardware unit. Alternatively, said control circuit 120, or parts thereof, may be implemented with programmable and/or configurable hardware units, such as but not limited to one or more field-programmable gate arrays (FPGAs), processors, or microcontrollers. Thus, the control circuit may be a programmable control circuit. Hence, embodiments of the present disclosure may be embedded in a computer program product, which enables implementation of the method and functions described herein, e.g. the embodiments of the methods described with reference to FIGS. 5-6. Therefore, according to embodiments of the present invention, there is provided a computer program product, comprising instructions arranged to cause the programmable control circuit to perform the steps of any of the embodiments of said methods. The computer program product may comprise program code which is stored on a computer readable medium 500, as illustrated in FIG. 7, which can be loaded and executed by said programmable control circuit, to cause it to perform the steps of any of the embodiments of said methods.

Some simulation results are presented below with reference to FIGS. 8-9. The simulations have been performed using a numerical simulator. A normalized sampling frequency of $f_s=1$ sample per unit time has been used, with a single-tone input signal at the frequency $f_{sig}=0.1\ f_s$. A nominal sub ADC gain of 1 has been used. A random gain error with normal distribution, mean value 0 and standard deviation 0.05 have been applied to the individual sub ADCs. No nonlinearity errors or dc offsets in the sub ADCs have been considered in the simulations, only the gain errors. In the plots shown, the two input and two output case has been considered for the TI ADC circuit 30, i.e. L=2. Furthermore, the parameters M and K for the TI ADC circuit are M=8 and K=20>2M=16. In the simulations of the TI ADC circuit 30, the case where the selection of the sub ADCs 100-1—100-K such that each of the sub ADCs 100-1—100-K sometimes operates on input samples of the first analog input signal and sometimes operates on input samples of the second analog input signal has been used. For each sample of the first analog input signal and the second analog input signal, there is a random selection, with equal probability for each of the sub ADCs, of which of the currently available sub ADCs should be used to process that sample.

Figure 8:
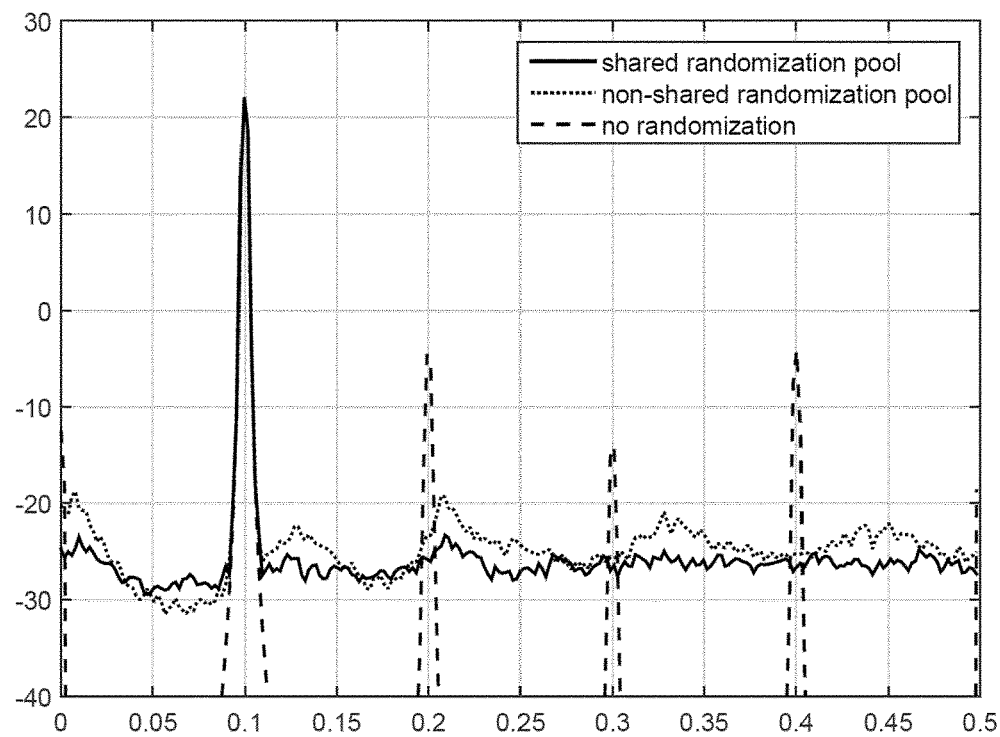
FIGS. 8-9 show simulation results.
Figure 9:
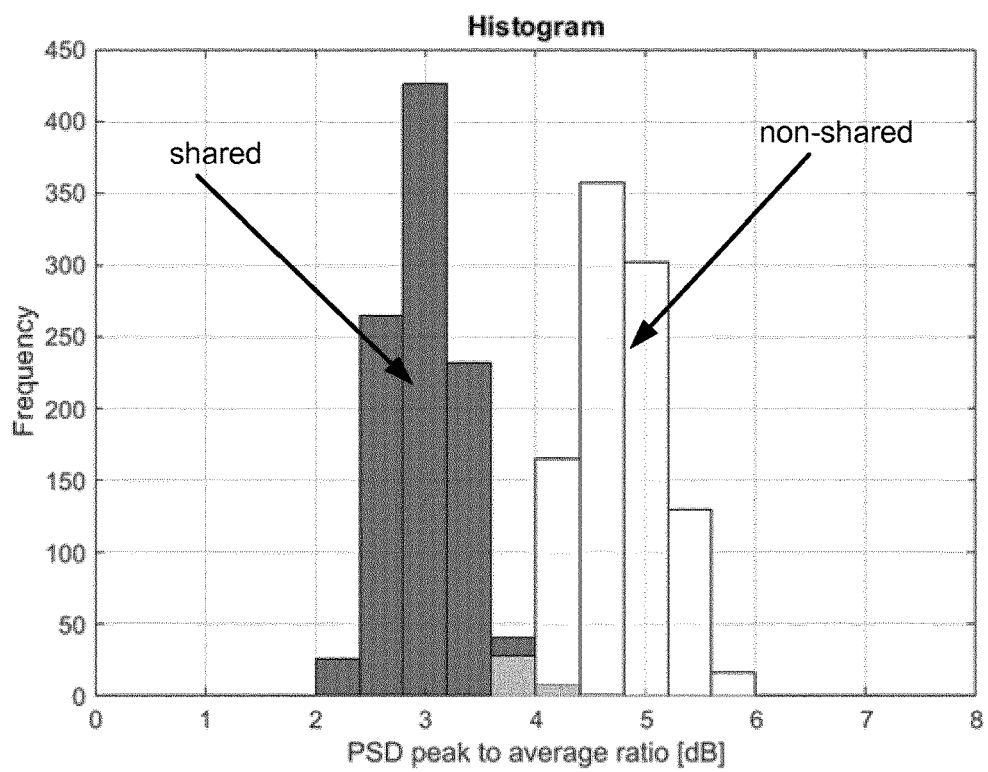

FIG. 8 shows simulated signal spectra. The solid line, labeled "shared randomization pool", is the spectrum for the TI ADC circuit 30. The spectrum shown is that for the first digital output signal. The dotted line, labeled "non-shared randomization pool", is the spectrum of a conventional redundant TI ADC constructed with the first 10 (=K/2) sub ADCs 100-1—100-10 of the TI ADC circuit 30 operating on the first analog input signal and random selection for each sample, with equal probability for each sub ADC, of available sub ADC to operate on that sample. The dashed line, labeled "no randomization" is the spectrum of the same TI ADC as for the "non-shared randomization pool", constructed with the first 10 (=K/2) sub ADCs 100-1—100-10 of the TI ADC circuit 30. However, for the "no randomization" case, the sub ADCs are always operated in the same order in a periodically repeated pattern. This corresponds to a conventional TI ADC built with the same amount of hardware in terms of number of sub ADCs. The x axis shows the normalized frequency and the y axis is the power spectral density (PSD) in dB. The sub ADCs have been simulated with infinite resolution, i.e. there is no quantization noise. The "shared randomization pool" and "non-shared randomization pool" simulations thus employ random scrambling, whereas the "no randomization" simulation does not employ scrambling.

The large peak at the frequency 0.1 is the wanted signal. For the conventional TI ADC (dashed line), relatively large spurious peaks are visible also at frequencies 0.2, 0.3, and 0.4. For the conventional redundant TI ADC (dotted line) these peaks are reduced, as expected, and the distortion has been smeared out over frequency. For the TI ADC circuit 30 (solid line), the distortion peaks are even further reduced.

The spectra plotted in FIG. 8 are results for a single set of sub ADCs. Due to the random nature of the gain errors, the results for different sets of sub ADCs (e.g. for different integrated circuit chips), the results may be quantitatively different even though they are qualitatively the same. In order to investigate variations over sets of sub ADCs, simulations such as that shown in FIG. 8 were performed for 1000 different sets of sub ADCs were performed. As a metric for the performance in terms of distortion peak reduction, the PSD peak to average ratio for the distortion, i.e. for the spectrum excluding the frequency range occupied by the wanted signal, has been used. The lesser the peak-to-average ratio, the better is the peak reduction performance. The simulation results are shown in histograms in FIG. 9. The gray histogram, marked "shared", is for the TI ADC circuit 30. The white histogram, marked "non-shared", is for the conventional redundant TI ADC used as a reference example. The TI ADC circuit 30 can clearly be seen as having the better performance in terms of peak to average ratio. Thus, in a situation where two (or more) analog signals need to be converted to digital representation, such as in a quadrature receiver with an I signal component and a Q signal component, a TI ADC circuit 30 according to embodiments of this disclosure results in a better suppression of distortion peaks than two conventional redundant TI ADCs with the same total number of sub ADCs. This can for example be exploited to reduce the total number of sub ADCs for a given performance requirement. For instance, in order to obtain results comparable to that of the TI ADC circuit 30 that are shown in the histogram in FIG. 9 with a conventional redundant TI ADC, simulations have shown that the conventional redundant TI ADC would need 15 sub ADCs, which results in a total of 30 sub ADCs for two such redundant TI ADCs, which is considerably higher than the 20 sub ADCs used in the TI ADC circuit 30 in the simulations whose results are shown in FIGS. 8-9.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A time-interleaved, TI, analog-to-digital converter, ADC, circuit, comprising:
    a plurality of L analog inputs, wherein an i:th analog input is for receiving an i:th analog input signal;
    a plurality of L digital outputs, wherein an i:th digital output is for outputting an i:th digital output signal, which is a digital representation of the i:th analog input signal, wherein the TI ADC circuit is configured to generate one sample of each of the L digital output signals per conversion cycle;
    a set of sub ADCs, wherein each sub ADC is configured to generate a digital output sample in M conversion cycles, wherein M is an integer>1, and wherein the number of sub ADCs in the set is K and K>L·M; and
    a control circuit configured to select, for each input sample of each of the L analog input signals, which available sub ADC in the set of sub ADCs should operate on that input sample, such that at least some of the sub ADCs, over time, operate on input samples of each of the L analog input signals, wherein the control circuit is configured to select the sub ADCs according to a random or pseudo random selection scheme.

2. The TI ADC circuit according to claim 1:
    wherein L=2;
    wherein the plurality of analog inputs comprises:
    a first analog input for receiving a first analog input signal; and
    a second analog input for receiving a second analog input signal;
    wherein the plurality of digital outputs comprises:
    a first digital output for outputting a first digital output signal, which is a digital representation of the first analog input signal; and
    a second digital output for outputting a second digital output signal, which is a digital representation of the second analog input signal;
    ; wherein K>2M; and
    wherein the control circuit is configured to select, for each input sample of the first analog input signal and the second analog input signal, which available sub ADC in the set of sub ADCs should operate on that input sample, such that at least some of the sub ADCs sometimes operate on input samples of the first analog input signal and sometimes operate on input samples of the second analog input signal.

3. The TI ADC circuit according to claim 2, wherein the first analog input signal is an in-phase, I, component and the second analog input signal is a quadrature-phase, Q, component of a quadrature communication signal.

4. The TI ADC circuit according to claim 3, wherein the control circuit is configured to select the sub ADCs such that each of the sub ADCs, over time, operates on input samples of each of the L analog input signals.

5. The TI ADC circuit according to claim 1, further comprising a random, or pseudo random, generator circuit configured to generate a random, or pseudo random, sequence, wherein the control circuit is configured to use the random, or pseudo random, sequence to select, for each input sample of each of the L analog input signals, which available sub ADC in the set of sub ADCs should operate on that input sample.

6. A receiver circuit comprising:
    a time-interleaved, TI, analog-to-digital converter, ADC, circuit for converting a received analog signal to a digital representation, wherein the TI ADC circuit comprises:
    a plurality of L analog inputs, wherein an i:th analog input is for receiving an i:th analog input signal;
    a plurality of L digital outputs, wherein an i:th digital output is for outputting an i:th digital output signal, which is a digital representation of the i:th analog input signal, wherein the TI ADC circuit is configured to generate one sample of each of the L digital output signals per conversion cycle;
    a set of sub ADCs, wherein each sub ADC is configured to generate a digital output sample in M conversion cycles, wherein M is an integer >1, and wherein the number of sub ADCs in the set is K and K>L·M; and
    a control circuit configured to select, for each input sample of each of the L analog input signals and according to a random or pseudo random selections scheme, which available sub ADC in the set of sub ADCs should operate on that input sample, such that at least some of the sub ADCs, over time, operate on input samples of each of the L analog input signals.

7. A communication apparatus comprising a receiver circuit, wherein the receiver circuit comprises a time-interleaved, TI, analog-to-digital converter, ADC, circuit for converting a received analog signal to a digital representation, wherein the TI ADC circuit comprises:
    a plurality of L analog inputs, wherein an i:th analog input is for receiving an i:th analog input signal;
    a plurality of L digital outputs, wherein an i:th digital output is for outputting an i:th digital output signal, which is a digital representation of the i:th analog input signal, wherein the TI ADC circuit is configured to generate one sample of each of the L digital output signals per conversion cycle;
    a set of sub ADCs, wherein each sub ADC is configured to generate a digital output sample in M conversion cycles, wherein M is an integer>1, and wherein the number of sub ADCs in the set is K and K>L·M; and
    a control circuit configured to select, for each input sample of each of the L analog input signals and according to a random or pseudo random selections scheme, which available sub ADC in the set of sub ADCs should operate on that input sample, such that at least some of the sub ADCs, over time, operate on input samples of each of the L analog input signals.

8. The communication apparatus according to claim 7, wherein the communication apparatus is a wireless communication device for communication with a cellular network.

9. The communication apparatus according to claim 7, wherein the communication apparatus is a radio base station for a cellular communication network.

10. A method of controlling a time-interleaved, TI, analog-to-digital converter, ADC, circuit, the TI ADC circuit comprising a plurality of L analog inputs, a plurality of L digital outputs, a set of sub ADCs, and a control circuit, wherein an i:th analog input is for receiving an i:th analog input signal, wherein an i:th digital output is for outputting an i:th digital output signal, which is a digital representation of the i:th analog input signal, wherein the TI ADC circuit is configured to generate one sample of each of the L digital output signals per conversion cycle, wherein each sub ADC is configured to generate a digital output sample in M conversion cycles, wherein M is an integer>1, and wherein the number of sub ADCs in the set is K and K>L·M, wherein the method comprises:
  selecting, by the control circuit according to a random or pseudo random selection scheme and for each input sample of each of the L analog input signals, which available sub ADC in the set of sub ADCs should operate on that input sample, such that at least some of the sub ADCs, over time, operate on input samples of each of the L analog input signals.

11. The method according to claim 10, wherein L=2, wherein the plurality of analog inputs comprises a first analog input for receiving a first analog input signal and a second analog input for receiving a second analog input signal, wherein the plurality of digital outputs comprises a first digital output for outputting a first digital output signal, which is a digital representation of the first analog input signal, and a second digital output for outputting a second digital output signal, which is a digital representation of the second analog input signal, wherein K>2M, and wherein the selecting the sub ADCs comprises selecting, by the control circuit and for each input sample of the first analog input signal and the second analog input signal, which available sub ADC in the set of sub ADCs that should operate on that input sample, such that at least some of the sub ADCs sometimes operate on input samples of the first analog input signal and sometimes operate on input samples of the second analog input signal.

12. The method according to claim 11, wherein the first analog input signal is an I component and the second analog input signal is a Q component of a quadrature communication signal.

13. The method according to claim 10, wherein selecting sub ADCs comprises selecting the sub ADCs such that each of the sub ADCs, over time, operates on input samples of each of the L analog input signals.

* * * * *